United States Patent [19]

El-Kareh et al.

[11] Patent Number: 5,933,718
[45] Date of Patent: Aug. 3, 1999

[54] METHOD FOR ELECTROSTATIC DISCHARGE PROTECTION THROUGH ELECTRIC FIELD EMISSION

[75] Inventors: Badih El-Kareh, Austin, Tex.; Jack A. Mandelman, Stormville, N.Y.; James G. Ryan, Newtown, Conn.

[73] Assignee: International Business Machines Corporation, Armonk, N.Y.

[21] Appl. No.: 08/956,822

[22] Filed: Oct. 23, 1997

[51] Int. Cl.$^6$ .............................................. H01L 21/8238
[52] U.S. Cl. ......................... 438/200; 438/586; 438/683
[58] Field of Search ................................. 438/200, 233, 438/583, 586, 647, 649, 655, 656, 657, 683, 684

[56] References Cited

U.S. PATENT DOCUMENTS

| 3,676,742 | 7/1972 | Russell et al. | 317/33 R |
|---|---|---|---|
| 4,794,437 | 12/1988 | Palumbo | 357/23.13 |
| 4,891,730 | 1/1990 | Saddow et al. | 361/111 |
| 5,357,397 | 10/1994 | Leary | 361/220 |
| 5,468,667 | 11/1995 | Diaz et al. | 438/586 |
| 5,516,717 | 5/1996 | Hsu | 438/586 |
| 5,532,178 | 7/1996 | Liaw et al. | 438/200 |
| 5,683,918 | 11/1997 | Smith et al. | 438/586 |

*Primary Examiner*—Chandra Chaudhari

[57] ABSTRACT

An ESD protective device is formed having a repeatable gap dimension for reliable protection by the formation of a discharge, using the materials of the gate stack for economy and a sacrificial dielectric formed between the plug and the other terminal for repeatable definition of a discharge gap.

4 Claims, 5 Drawing Sheets

METHOD FOR ELECTROSTATIC DISCHARGE PROTECTION THROUGH ELECTRIC FIELD EMISSION

TECHNICAL FIELD

The field of the invention is the protection of integrated circuits from damage caused by electrostatic discharge.

BACKGROUND OF THE INVENTION

Damage to integrated circuits through electrostatic discharge is a well known problem. The voltage in a discharge can easily reach a value of thousands of volts, while the damage threshold of devices within a circuit may be about 10 volts.

Conventionally, PN junctions are connected in parallel with the input/output terminals of the circuit, with a series resistance in the path of the signals to slow down the rise time of the electrostatic discharge (ESD) voltage.

U.S. Pat. No. 5,357,397 suggests etching the metal interconnection layers to form a pair of metal points that can serve to initiate a field emission discharge. This approach suffers from a lack of repeatability because of the etching technique chosen.

SUMMARY OF THE INVENTION

The invention relates to an ESD-protective structure and a method for making it that provides improved uniformity and therefore improved reliability.

An advantage of the invention is low cost achieved by the use of existing standard process steps for the ESD structure, so that new process tools are not required.

Another advantage of the invention is the formation of a conformable layer of dielectric and its subsequent removal to provide a repeatable gap for the initiation of the field emission discharge.

DESCRIPTION OF THE PREFERRED EMBODIMENT

Referring now to FIG. 1, there is shown a series of steps in the fabrication of the invention, together with corresponding steps in the fabrication of transistors.

Figure 1A:
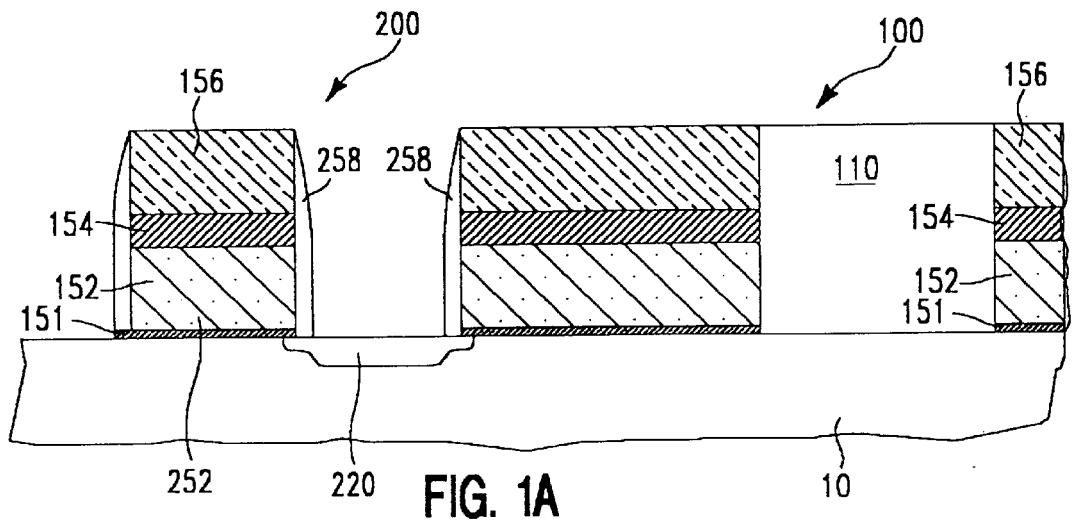
FIGS. 1A–1E illustrate steps in the formation of the devices, together with corresponding circuit fabricating steps.

FIG. 1A, there is shown in the center a step in the formation of an integrated circuit, in which a "gate stack" of gate oxide ($SiO_2$) 151, polycrystalline silicon (poly) 152 having a nominal thickness of 100 nm, WSi ("silicide") 154 having a nominal thickness of 50 nm and nitride ($Si_3N_4$)) 156 having a nominal thickness of 200 nm has been put down over the wafer and patterned to define simultaneously transistor gate 200 (above source and drain 210) and to form aperture 110 that will be used in ESD device 100. A conventional dry etch process using Cl chemistry is used to pattern the gate stack. The single transistor shown on the left is a schematic representation of an integrated circuit that is to be protected by the ESD protection device described herein.

Aperture 110, which will contain the ESD structure, is blocked by photoresist or any other convenient material that can be removed selectively to Nitride, $WSi_x$ and poly, such as oxide, during the steps described below. The material in aperture 110 will be referred to as a "placeholder". For convenience and clarity of exposition, the Figure also includes the additional steps in transistor 200 of forming conventional gate conductor sidewall insulating spacers 258 and implanting source and drain 220. These steps are performed at any convenient time and are not necessarily present when the ESD device is at the stage shown in the Figure.

This embodiment illustrated has the advantage that compatible process steps are used to establish the ESD protective device and to form the circuit, so that duplication of process steps is minimized and the extra expense of new process tools is avoided. Additional masking layers needed to differentiate the ESD device from existing structures are simple and relatively inexpensive.

At a convenient point in the process, such as after the implantation of the transistor source and drain, the areas above the source and drain of the transistor are covered with a layer of any convenient material, e.g. oxide 265, which is planarized in a conventional chemical-mechanical polishing step using nitride 156 as a polish stop. The oxide fill in aperture 110 is then removed, e.g. with a wet etch. A plasma etch using $CF_4$/Cl $O_2$ chemistry and having less than about 8% of oxygen is applied to aperture 110, but not to the remainder of the circuit. This chemistry is rather nondirectional and will etch to the side. The degree of directionality is not critical and the etch need not be isotropic. Conventional steps such as blocking parts of the wafer with photoresist during an etch process will be omitted for simplicity.

Since the WSi is more resistant to the etching process than the poly or nitride, there is a projection of layer 154; i.e. the other layers are recessed. The result is a small radius of curvature on the projection of layer 154, typically less than 100 Å. Sharp asperities will be left as the etching process attacks micro-crystals of WSi at different rates, so the effective radius of curvature for the formation of a discharge will be smaller than the nominal value.

The lower part of aperture 110 has a width greater by twice a distance 114 than the width at layer 154 and the upper part has a width greater by twice a distance 112. Since poly etches at twice the rate of nitride in this chemistry, the aperture will be somewhat wider at the level of the poly. Preferably, the distances 112 and 114 are about equal and have a value of between about 10–20 nm.

Figure 1B:
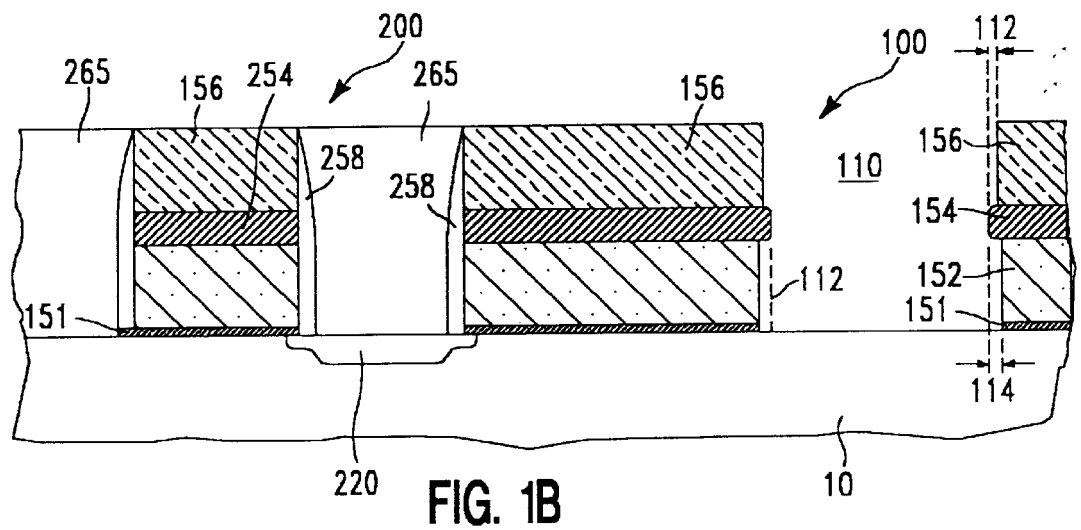
Figure 1C:
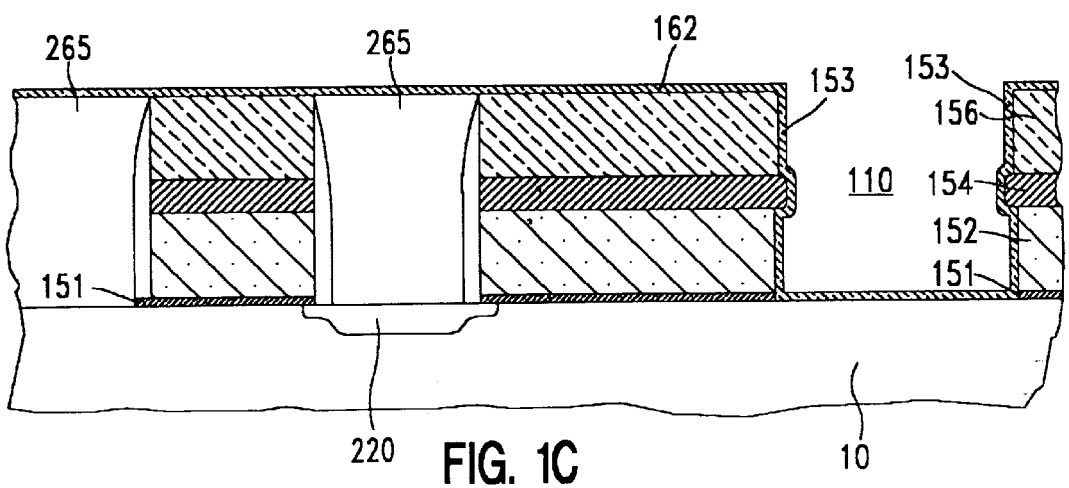

In FIG. 1C, a layer of conformal oxide (or other suitable sacrificial material) 162 has been deposited or grown in aperture 110 to a thickness of about 5 nm while the remainder of the circuit is blocked. Note that it extends around the projection of layer 154 in a curved region denoted with numeral 153. Illustratively, layer 162 is CVD oxide. The thickness of this layer will define the gap for ESD protection.

Figure 1D:
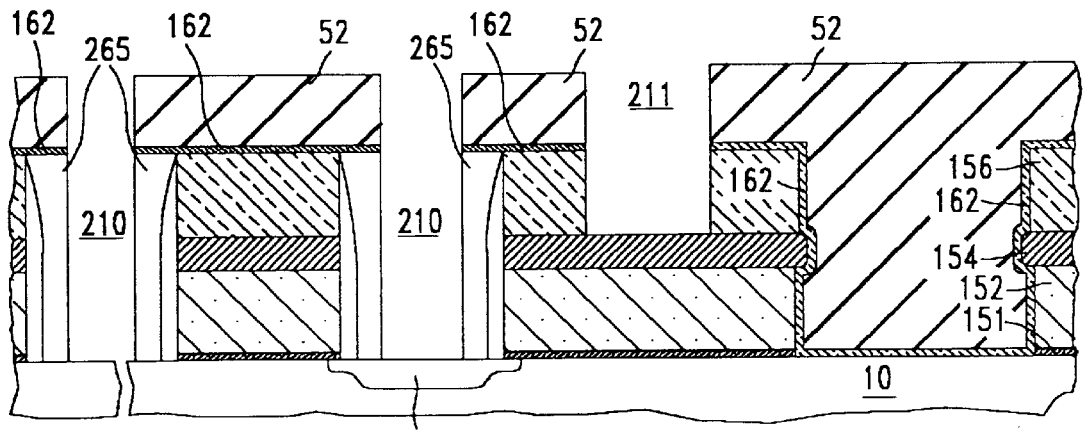
Figure 1E:
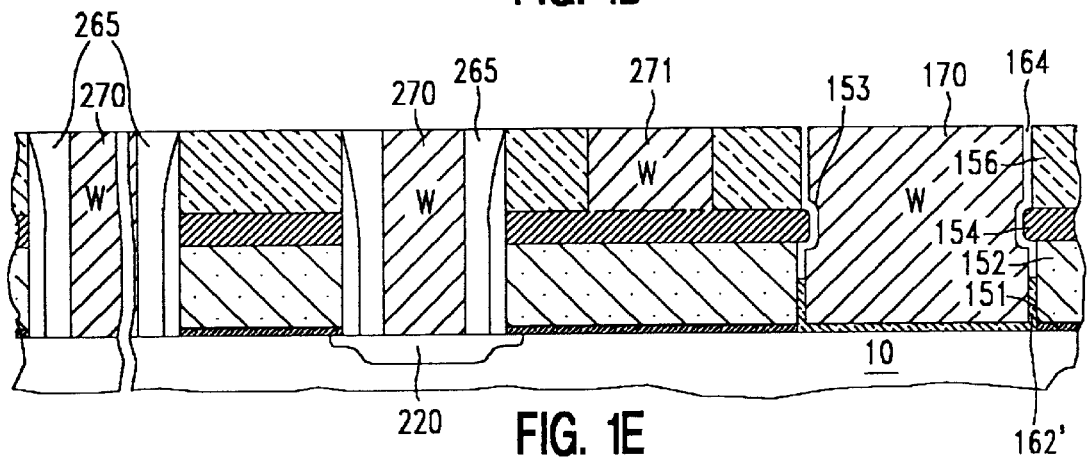

In FIG. 1D, the result of some conventional intermediate steps is shown, in which insulator 265 that was formed, as described with reference to FIG. 1B, about the transistor gates has been etched to form contact apertures 209 above source and drain 220 and another contact aperture 211 that will be the contact between an input/output pad and the ESD device 100. On the right, aperture 110 is blocked by resist 52 in order to prevent damage to oxide 162 during the etching process. Next, as shown in FIG. 1E, contact apertures 110, 209 and 211 are filled with any convenient conductor such as poly or W, which has been planarized in a chemical-mechanical polish using nitride 156 as a polish stop, forming W studs 170, 270 and 271. Studs 270 are the conventional source and drain connectors used in the circuit. Studs 170 and 271 are connected respectively to ground and to an I/O pad.

In FIG. 1E, oxide 162 is removed by a non-critical conventional wet etch using buffered HF to a distance below layer 154, leaving a residual amount of oxide 162' and a gap 164. W stud 170 has a recess 153 where it was formed about the temporary oxide layer 162 that is useful in providing bidirectional operation with no additional process steps. When layer 154 is negative with respect to plug 170, layer 154 is the emitter of electrons. When plug 170 is negative, the sharp corners of the recess emit electrons, so that the ESD device functions for both polarities.

The top of gap 164 is sealed by the deposition of the next insulator layer, typically oxide, which does not penetrate gap 164 to any appreciable distance. Some penetration will not affect ESD performance, so long as it does not block the gap at layer 154.

Figure 2:
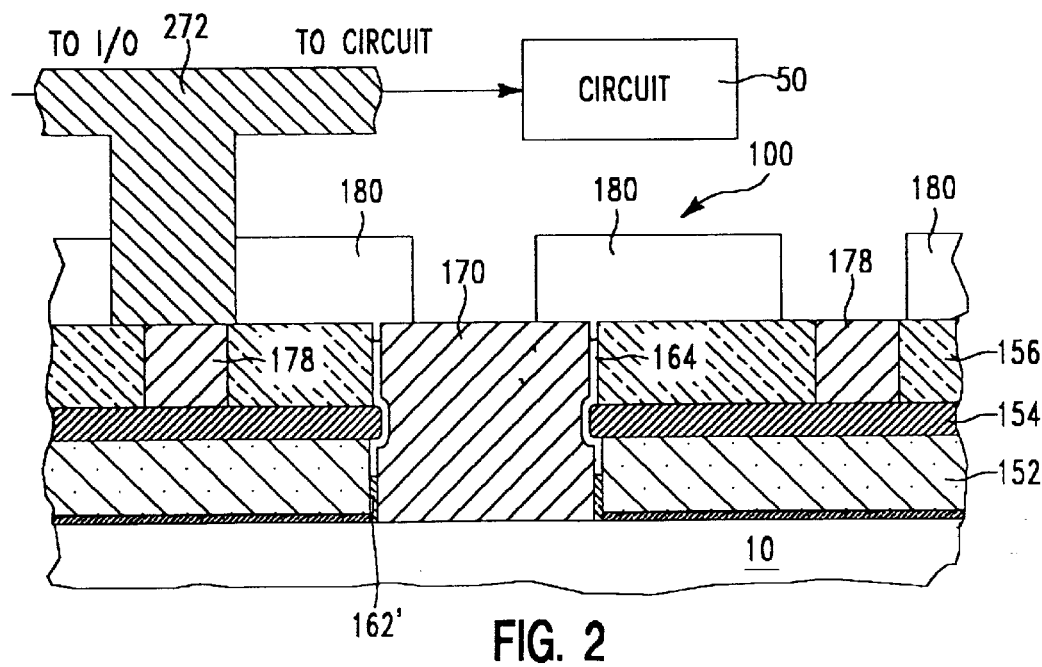
FIG. 2 illustrates the completed device.

Referring to FIG. 2, there is shown an example of a finished ESD device 100, in which plug 170, connected to ground, forms the center of device 100, with gap 164 between it and layer 154. At the left, stud 178 is formed at the same time as stud 170, the etch stopping on W layer 154, and connects through insulator 180 to interconnection member 272, which connects to an I/O pin and to the remainder of the circuit, shown schematically as box 50, which represents the remainder of the I/O and a set of transistors as required to form a desired circuit.

Referring now to FIGS. 3A–3H, there is shown an alternative method of constructing the device. This method uses two W deposition and polishing steps, but has the advantage that multiple "placeholder" steps (with oxide or photoresist, as in the alternative embodiment) are not required.

Figure 3A:
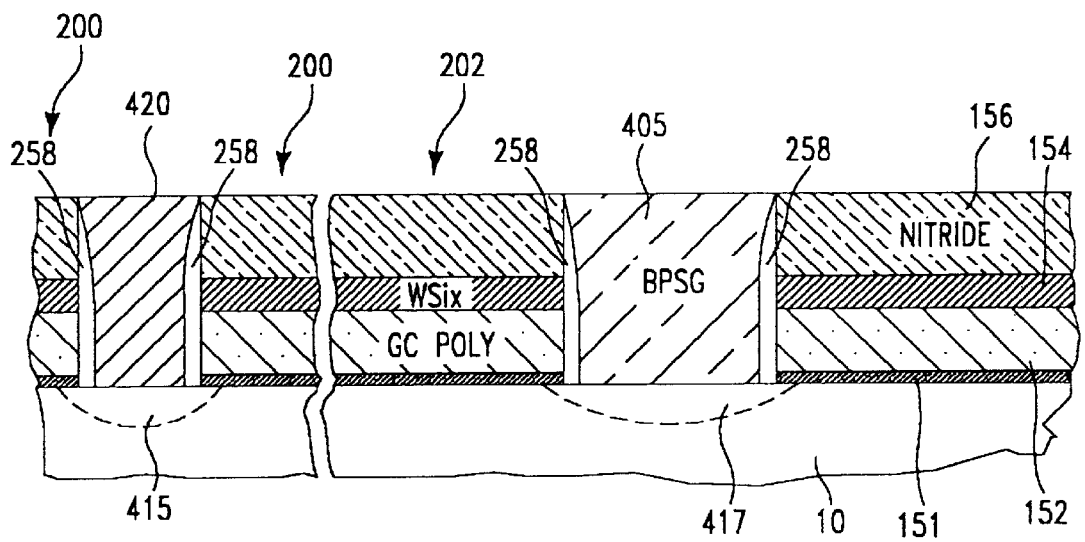
FIGS. 3A–3H illustrate steps in a preferred method of forming the devices.

FIG. 3A shows on the right an area that will contain the ESD device and a conventional (support) transistor. On the left, a portion of a DRAM memory array is illustrated, in which transistors and connections will be formed at times overlapping the sequence in the formation of the support transistors outside the memory array. The gate stack layers 151, 152, 154 and 156 are the same as in FIG. 1. An aperture on the right has been filled with BPSG (boron-doped glass) that will contain the contact to a support transistor (with the BPSG planarized using the nitride cap 156 as the polish stop). Conventional sidewall spacers 258 have been formed at the edge of the aperture.

On the left, a poly stud has been formed that will provide a connection between bitline 415 in the array and upper interconnections. As is conventional, two transistors 200 share a bitline.

Figure 3B:
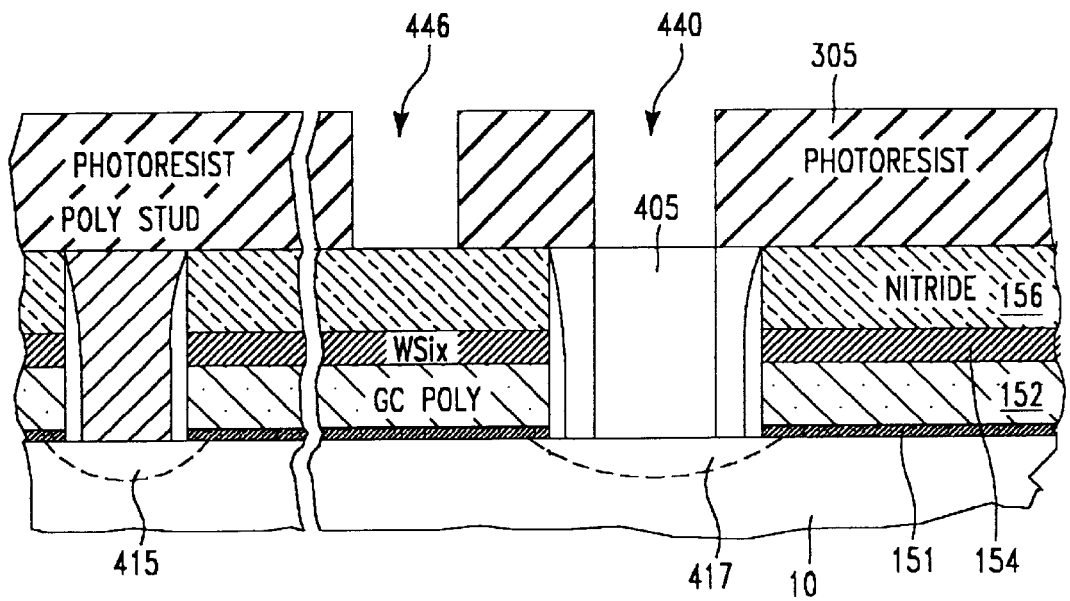
Figure 3C:
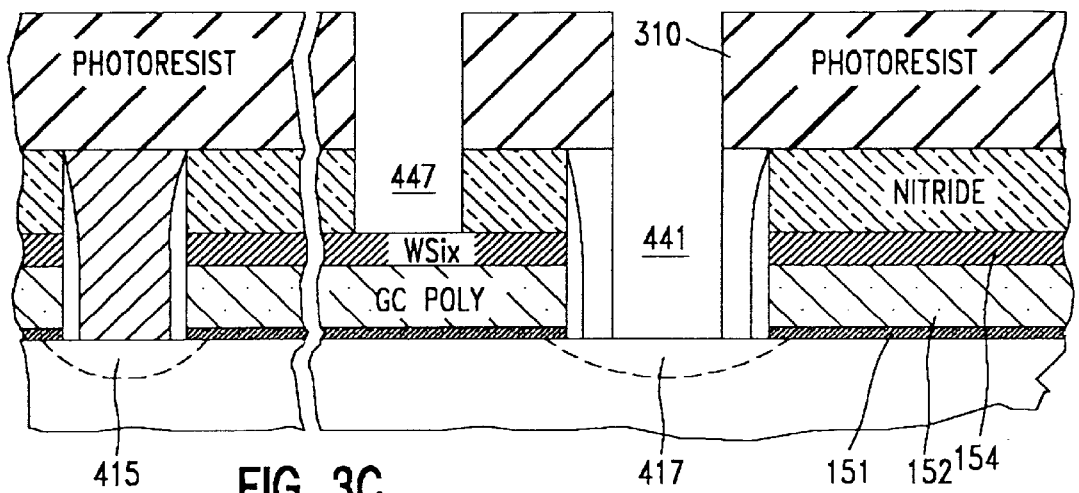

In FIG. 3B, photoresist 305 has been deposited and patterned to contain apertures 440 for a contact to source 417 and aperture 446 for a contact to the gate of the support transistor 202. In FIG. 3C, apertures 441 and 447 have been etched, stopping on the W layer of the gate of transistor 202 and on the silicon of the source 417.

Figure 3D:
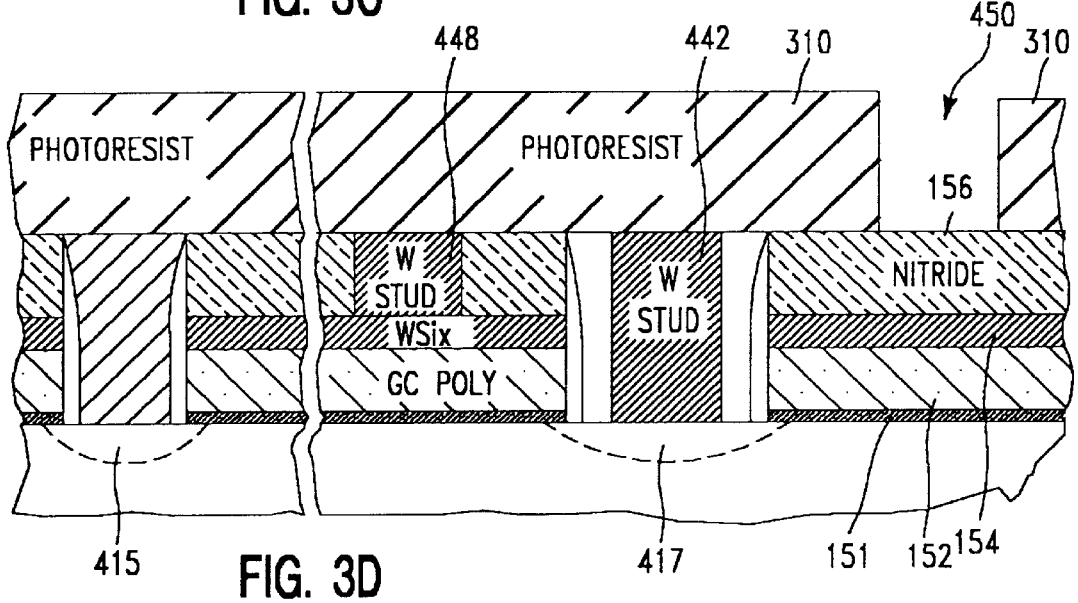
Figure 3E:
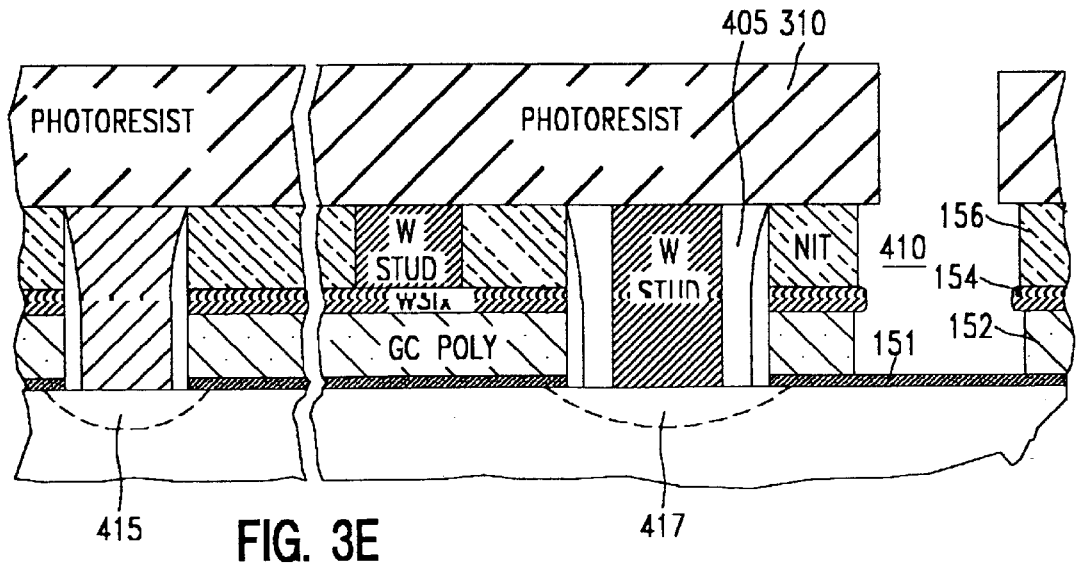
Figure 3F:
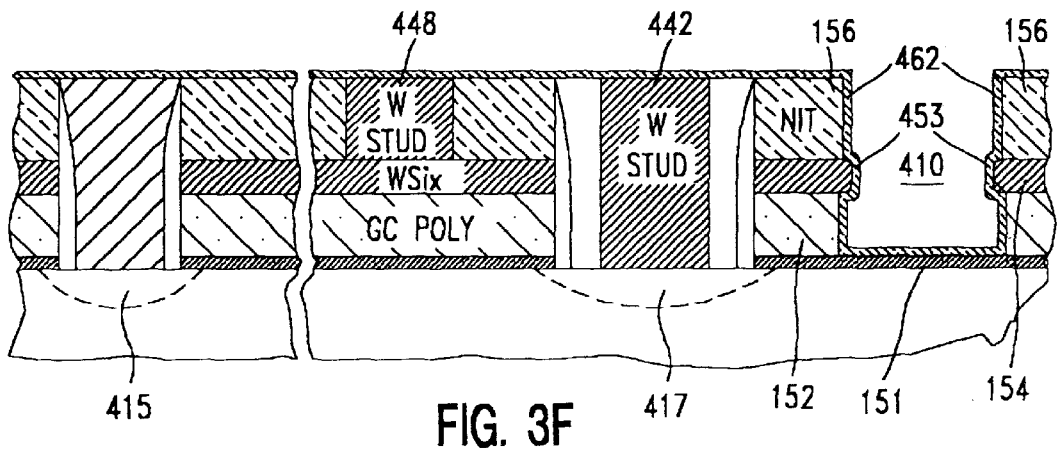

These apertures are filled with W and planarized using nitride 156 as the polish stop, as described in the previous embodiment. FIG. 3D shows the next patterning step in which photoresist 310 has been patterned with the apertures for the ESD devices. The same less-directional etch as described with respect to the previous embodiment is used to open and widen the ESD aperture (FIG. 3E). A thin conformal oxide layer 462 is deposited, leaving a curved region 453, as before (FIG. 3F).

Figure 3G:
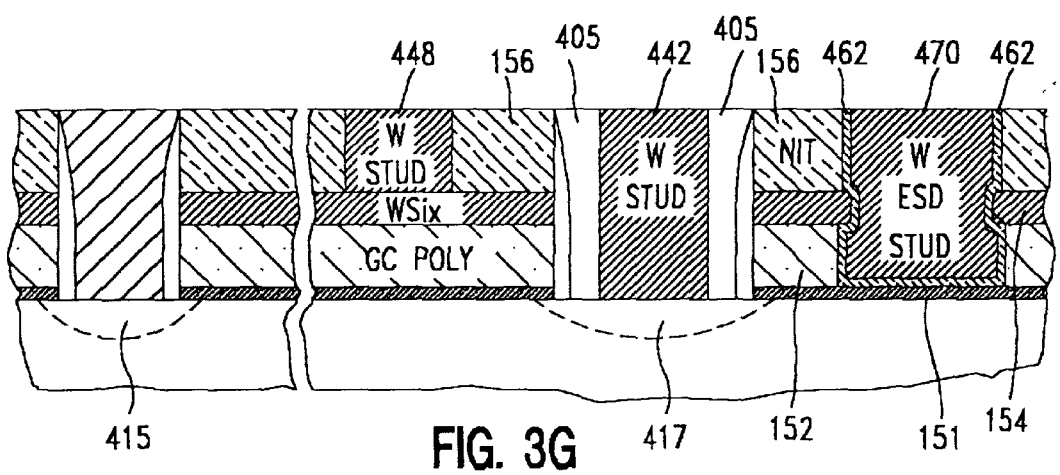
Figure 3H:
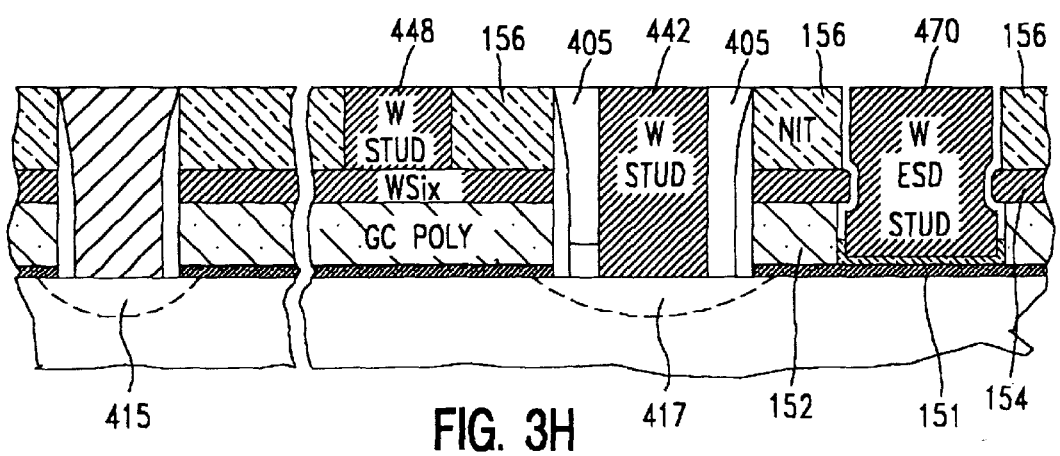

FIGS. 3G and 3H show the remaining steps, which correspond to the previous embodiment of filling and planarizing another W layer and etching the conformal oxide 462 to open the aperture for the ESD discharge.

For convenience and clarity in the following claims, the term "preparing the substrate" will be used to refer to a set of conventional processes, well known to those skilled in the art, such as pad nitride and oxide, forming wells for CMOS circuits, threshold implants, oxide isolation and the like. Similarly, the phrase "completing the circuit" will be used to refer to conventional back end steps such as forming inter-level dielectric, depositing metal and patterning the layer of metal to form interconnections, forming vias and studs between layers of metallization, repeating metallization layers as needed, formed input/output terminals and the like. The term "patterning" with respect to a layer will be used to refer to the steps of preparing, exposing and developing a layer of photoresist and etching the layer to impress the pattern that was exposed in the resist in the layer.

The order of steps is not critical, though it is preferable to reduce cost by using the same step for the ESD device and the rest of the circuit where practical. The materials used are also not critical, and other conductors could be substituted for the W or WSi.

While the invention has been described in terms of a single preferred embodiment, those skilled in the art will recognize that the invention can be practiced in various versions within the spirit and scope of the following claims.

We claim:

1. A method of fabricating an integrated circuit having at least one ESD protective structure comprising the steps of:

preparing a silicon substrate;

forming a gate stack containing at least a poly layer, a conductive etch-resistant layer and an insulating layer above said substrate;

patterning said gate stack to form simultaneously a plurality of transistor gate structures for said circuit and also at least one ESD aperture, having an ESD aperture wall, for said at least one ESD protective structure;

completing a set of transistors on at least some of said transistor gate structures;

etching said at least one ESD aperture wall of said at least one ESD aperture in a substantially non-directional etch that etches said conductive etch-resistant layer at a lower rate than said poly layer and said insulating layer, whereby said etch-resistant layer projects into said ESD aperture;

forming a conformable second dielectric layer on said aperture walls to a gap thickness;

depositing a layer of stud material at least in said ESD aperture;

removing portions of said layer of stud material outside said ESD aperture, thereby forming an ESD stud in said ESD aperture;

removing said second dielectric layer to a level below said conductive etch-resistant layer, thereby forming a discharge gap between said ESD stud and said conductive etch-resistant layer; and completing said integrated circuit, including the step of connecting said ESD stud to a ground terminal and connecting a portion of said conductive etch-resistant layer separated from said ESD stud by said discharge gap to an input/output pad.

2. A method according to claim 1, further including the steps of:

depositing a third dielectric layer over said integrated circuit before said step of depositing said stud layer;

opening a set of stud apertures in said third dielectric layer, said set of stud apertures including a subset of apertures substantially aligned with sources and drains; and depositing said stud layer simultaneously in said at least one ESD aperture and in said subset of apertures.

3. A method according to claim 2, in which:

said set of stud apertures includes an ESD contact stud aperture contacting said layer of conductive etch-resistant material, whereby said step of opening said set of stud apertures also opens said ESD contact aperture.

4. A method according to claim 2, in which:

said layer of conductive etch-resistant material is Wsi and said stud material is W.

\* \* \* \* \*